(12) United States Patent
Yu et al.

(10) Patent No.: US 11,094,671 B2
(45) Date of Patent: Aug. 17, 2021

(54) PACKAGE WITH THINNED SUBSTRATE

(71) Applicant: Taiwan Semiconductor Manufacturing Co., Ltd., Hsinchu (TW)

(72) Inventors: Chen-Hua Yu, Hsinchu (TW); Chung-Hao Tsai, Huatan Township (TW); Chuei-Tang Wang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/895,459

(22) Filed: Jun. 8, 2020

(65) Prior Publication Data
US 2020/0303342 A1    Sep. 24, 2020

Related U.S. Application Data

(60) Continuation of application No. 16/048,960, filed on Jul. 30, 2018, now Pat. No. 10,679,968, which is a
(Continued)

(51) Int. Cl.
*H01L 25/065* (2006.01)
*H01L 21/56* (2006.01)
(Continued)

(52) U.S. Cl.
CPC ...... *H01L 25/0652* (2013.01); *H01L 21/4853* (2013.01); *H01L 21/561* (2013.01);
(Continued)

(58) Field of Classification Search
CPC ............ H01L 25/0652; H01L 21/4853; H01L 21/561; H01L 23/49838; H01L 23/49894; H01L 23/49827; H01L 24/17; H01L 25/0655; H01L 25/50; H01L 51/56; H01L 33/62; H01L 51/5012; H01L 51/5056; H01L 51/5088; H01L 2224/03914; H01L 2224/0401
(Continued)

(56) References Cited

U.S. PATENT DOCUMENTS 8,283,781 B2  10/2012  Wu et al.
8,361,842 B2  1/2013   Yu et al.
(Continued)

FOREIGN PATENT DOCUMENTS

CN  101740426 A  6/2010
CN  102222629 A  10/2011
(Continued)

*Primary Examiner* — Jonathan Han
(74) *Attorney, Agent, or Firm* — Slater Matsil, LLP

(57) ABSTRACT

A package includes a substrate, an Under-Bump Metallurgy (UBM) penetrating through the substrate, a solder region over and contacting the UBM, and an interconnect structure underlying the substrate. The interconnect structure is electrically coupled to the solder region through the UBM. A device die is underlying and bonded to the interconnect structure. The device die is electrically coupled to the solder region through the UBM and the interconnect structure. An encapsulating material encapsulates the device die therein.

20 Claims, 15 Drawing Sheets

Related U.S. Application Data division of application No. 15/229,302, filed on Aug. 5, 2016, now Pat. No. 10,134,708.

(51) Int. Cl.
  *H01L 21/48* (2006.01)
  *H01L 23/498* (2006.01)
  *H01L 23/00* (2006.01)
  *H01L 25/00* (2006.01)
  *H01L 25/10* (2006.01)
  *H01L 23/31* (2006.01)

(52) U.S. Cl.
  CPC .. *H01L 23/49827* (2013.01); *H01L 23/49838* (2013.01); *H01L 23/49894* (2013.01); *H01L 24/17* (2013.01); *H01L 25/0655* (2013.01); *H01L 25/50* (2013.01); *H01L 23/3128* (2013.01); *H01L 24/13* (2013.01); *H01L 24/16* (2013.01); *H01L 24/81* (2013.01); *H01L 25/105* (2013.01); *H01L 2224/13101* (2013.01); *H01L 2224/16225* (2013.01); *H01L 2224/16238* (2013.01); *H01L 2224/81001* (2013.01); *H01L 2224/81005* (2013.01); *H01L 2224/81801* (2013.01); *H01L 2224/95001* (2013.01); *H01L 2225/0652* (2013.01); *H01L 2225/06517* (2013.01); *H01L 2225/06548* (2013.01); *H01L 2924/15192* (2013.01); *H01L 2924/15311* (2013.01); *H01L 2924/181* (2013.01)

(58) Field of Classification Search
  USPC ........................................................ 257/737
  See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,598,772 B2 | 3/2017 | Lin et al. | |
| 9,984,981 B2 | 5/2018 | Chiu et al. | |
| 2010/0130000 A1 | 5/2010 | Sutou et al. | |
| 2011/0254151 A1 | 10/2011 | Lin et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0134559 A1* | 5/2013 | Lin | H01L 23/147 257/620 |
| 2013/0168848 A1 | 7/2013 | Lin et al. | |
| 2013/0307140 A1 | 11/2013 | Huang et al. | |
| 2014/0061924 A1* | 3/2014 | Chen | H01L 23/528 257/758 |
| 2014/0151890 A1* | 6/2014 | Mao | H01L 21/6835 257/773 |
| 2014/0183693 A1* | 7/2014 | Tsai | H01L 23/5223 257/532 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264853 A1 | 9/2014 | Lin et al. | |
| 2014/0264930 A1 | 9/2014 | Yu et al. | |
| 2014/0346665 A1 | 11/2014 | Lin et al. | |
| 2015/0235988 A1* | 8/2015 | Ray | H01L 21/568 257/774 |

FOREIGN PATENT DOCUMENTS

| | | |
|---|---|---|
| CN | 104269390 A | 1/2015 |
| CN | 104377171 A | 2/2015 |
| CN | 104617036 A | 5/2015 |
| CN | 105070667 A | 11/2015 |

\* cited by examiner

PACKAGE WITH THINNED SUBSTRATE

PRIORITY CLAIM AND CROSS-REFERENCE

This application is a continuation of U.S. patent application Ser. No. 16/048,960 filed on Jul. 30, 2018, which is a divisional of U.S. patent application Ser. No. 15/229,302, entitled "Package with Thinned Substrate," filed on Aug. 5, 2016, now U.S. Pat. No. 10,134,708 issued Nov. 20, 2018, which application is incorporated herein by reference.

BACKGROUND

In the packaging of integrated circuits, a plurality of device dies may be bonded on an interposer wafer, which includes a plurality of interposers therein. The interposers include Through-Silicon Vias (TSVs). After the bonding of the device dies, an underfill is dispensed into the gaps between the device dies and the interposer wafer. A curing process may then be performed to cure the underfill. A molding compound can be applied to encapsulate the device dies therein. The resulting interposer wafer and the top dies thereon are then sawed apart into a plurality of packages, with the packages including exposed electrical connectors such as solder balls. The packages are then bonded to package substrates or printed circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9A illustrate the cross-sectional view of intermediate stages in the formation of a package including Under-Bump Metallurgies (UBMs) penetrating through a substrate in accordance with some embodiments.

DETAILED DESCRIPTION

Figure 1:
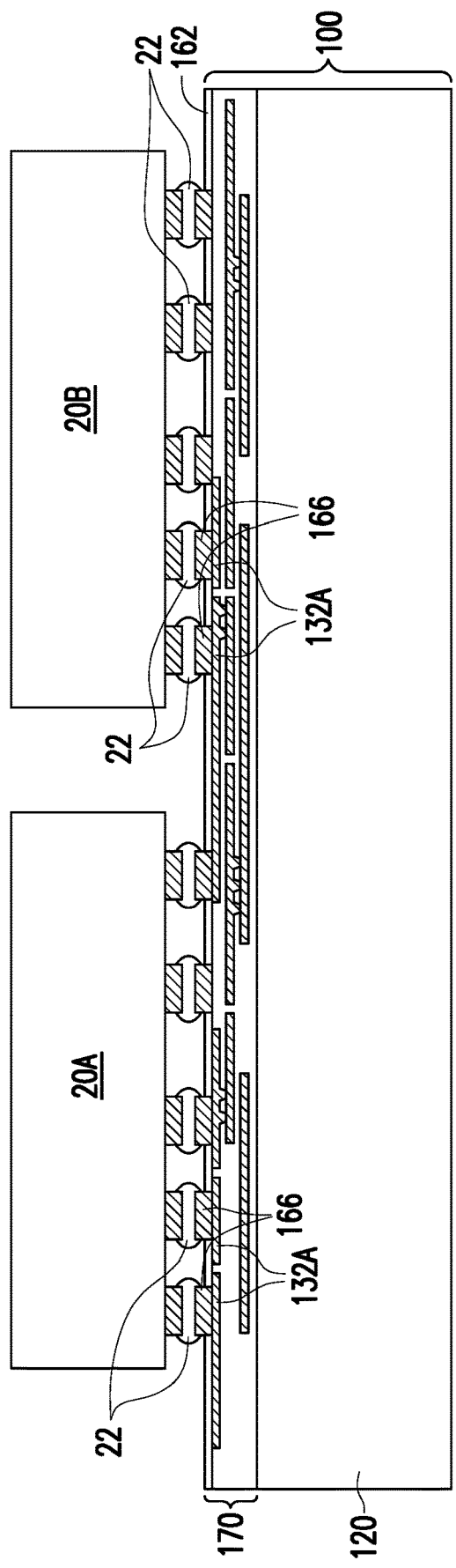

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including Under-Bump Metallurgies (UBMs) penetrating through a substrate and the method of forming the same are provided in accordance with various exemplary embodiments. Some variations of some embodiments are discussed. Throughout the various views and illustrative embodiments, like reference numbers are used to designate like elements.

Figure 11:
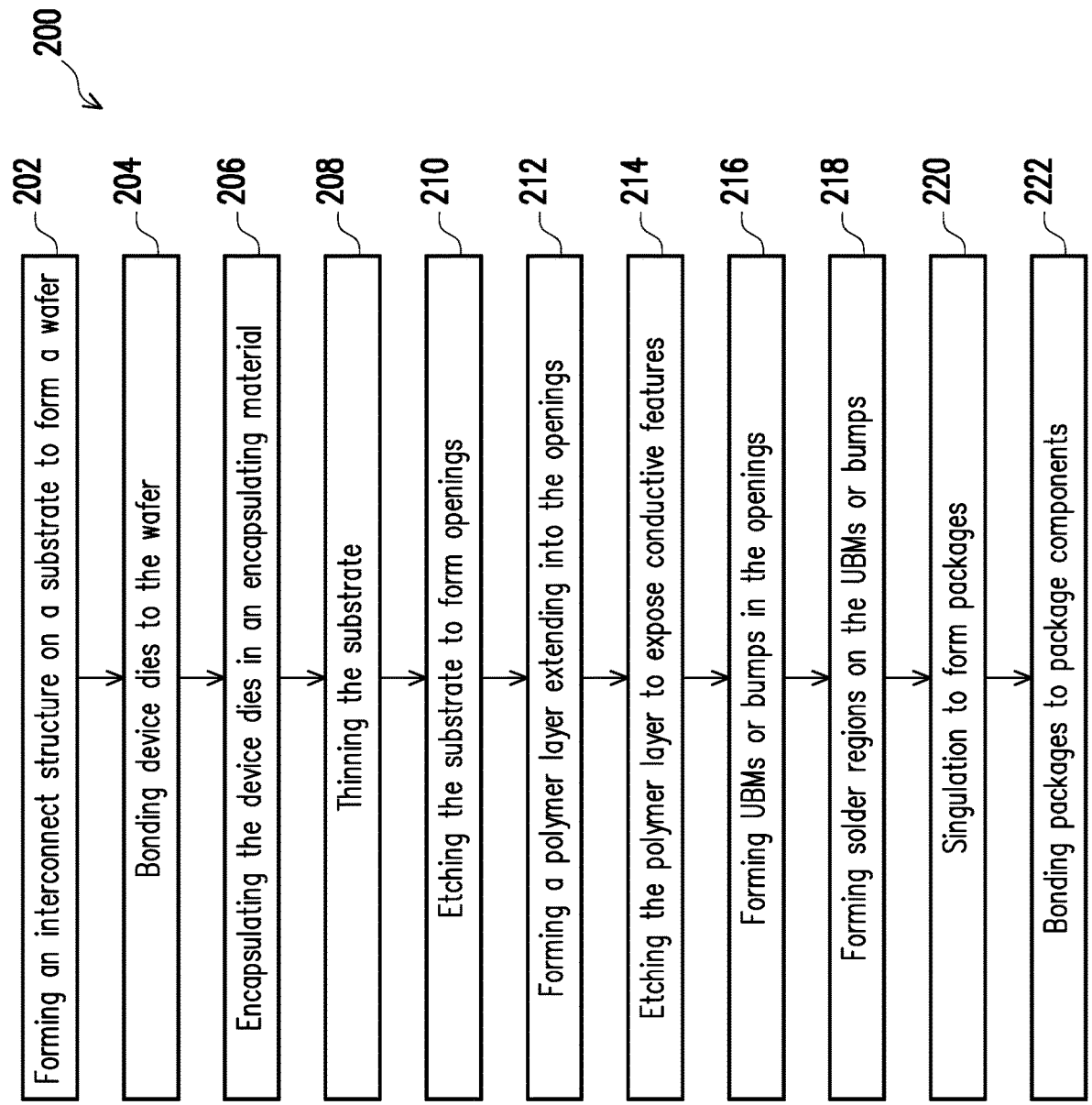
FIG. 11 illustrates a process flow for forming a package in accordance with some embodiment.

FIGS. 1 through 9A illustrate the cross-sectional views of intermediate stages in the formation of a package in accordance with some embodiments. The steps shown in FIGS. 1 through 9A also illustrated schematically in the process flow shown in FIG. 11.

FIG. 1 illustrates a cross-sectional view of wafer 100, which may have a round top view shape. In accordance with some embodiments, wafer 100 is free from active devices such as transistors and diodes, therein, and may be free from or may include passive devices such as capacitors, inductors, resistors, or the like. In accordance with alternative embodiments of the present disclosure, wafer 100 is a device wafer, which may or may not include active devices and/or passive devices.

Figure 10A:
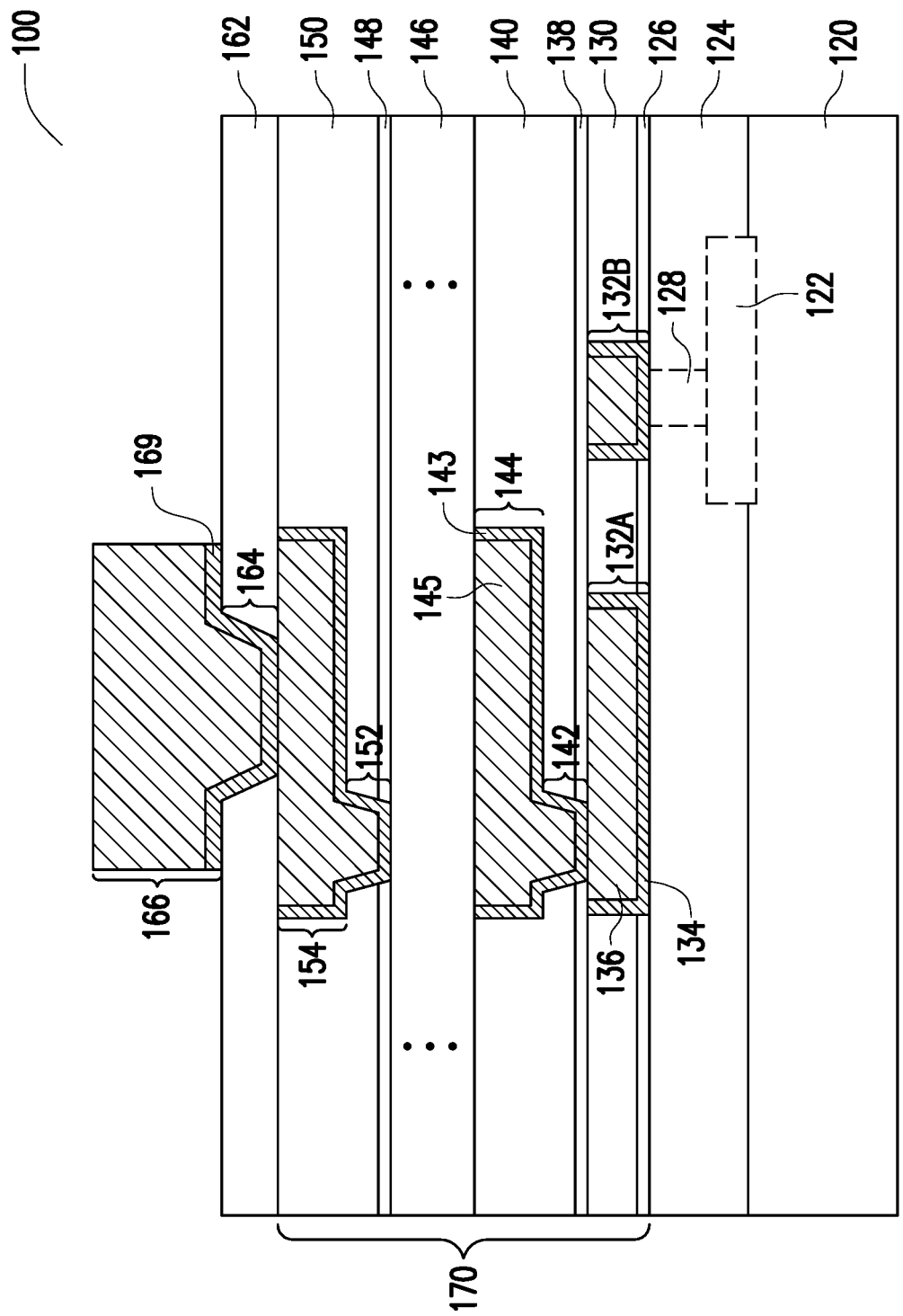
FIGS. 10A and 10B illustrate more detailed views of a portion of a wafer including a substrate in accordance with some embodiments.

FIG. 10A illustrates a more detailed view of a portion of wafer 100. Wafer 100 includes substrate 120. In accordance with some embodiments of the present disclosure, substrate 120 is a semiconductor substrate such as silicon substrate, which is formed of crystalline silicon. In accordance with alternative embodiments, substrate 120 is formed of a dielectric substrate such as a glass substrate, which may be formed of $SiO_2$, Silica glass, Borosilicate glass, Quartz, or Alkaline-free glass, or the like.

The formation of wafer 100 is briefly discussed as follows. First, active devices 122 (if any) and dielectric layer 124 are formed on substrate 120. In accordance with some embodiments in which active devices 122 are formed, dielectric layer 124 is an Inter-Layer Dielectric (ILD). Exemplary materials for forming dielectric layer 124 include, and are not limited to, phosphosilicate glass (PSG), borosilicate glass (BSG), boron-doped phosphosilicate glass (BPSG), fluorine-doped silicate glass (FSG), tetraethyl orthosilicate (TEOS), or the like. Dielectric layer 124 may also be formed of silicon oxide, silicon nitride, silicon oxynitride, silicon carbide, or the like. Dielectric layer 124 may be formed using spin-on coating, Flowable Chemical Vapor Deposition (FCVD), or the like. In accordance with alternative embodiments of the present disclosure, dielectric layer 124 is formed using a deposition method such as Plasma Enhanced Chemical Vapor Deposition (PECVD), Low Pressure Chemical Vapor Deposition (LPCVD), or the like.

In accordance with some embodiments in which active devices 122 are formed, contact plug(s) 128 is formed in dielectric layer 124, and is used to electrically connect active devices 122 to overlying metal lines and vias. In accordance with some embodiments of the present disclosure, contact plug 128 is formed of a conductive material selected from tungsten, aluminum, copper, titanium, tantalum, titanium nitride, tantalum nitride, alloys therefore, and/or multi-layers thereof. In accordance with alternative embodiments, no active device is formed, and no contact plug is formed in dielectric layer 124.

Next, interconnect structure 170 is formed over substrate 120 and dielectric layer 124. The respective step is illustrated as step 202 in the process flow shown in FIG. 11. Etch stop layer 126 may be formed over dielectric layer 124. Etch stop layer 126 may be formed of silicon carbide, silicon nitride, silicon oxynitride, silicon carbo-nitride, or the like. Etch stop layer 126 is also formed of a material that has a high etching selectivity relative to the overlying dielectric layer 130, and hence etch stop layer 126 may be used to stop the etching of dielectric layer 130.

Further illustrated in FIG. 10A is dielectric layer 130, which is alternatively referred to as Inter-Metal Dielectric (IMD) layer 130 hereinafter. In accordance with some embodiments of the present disclosure, IMD layer 130 is formed of a low-k dielectric material having a dielectric constant (k-value) lower than about 3.0, about 2.5, or even lower. IMD layer 130 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments, IMD layer 130 is formed of a non-low-k dielectric material such as silicon oxide, silicon nitride, silicon carbide, silicon oxynitride, or the like.

Conductive lines (or pads) 132 (including 132A and 132B, which are collectively referred to as 132) are formed in IMD layer 130. In accordance with some embodiments, conductive lines 132 include diffusion barrier layers 134 and copper-containing material 136 over diffusion barrier layers 134. Diffusion barrier layers 134 may include titanium, titanium nitride, tantalum, tantalum nitride, or the like, and have the function of preventing copper in copper-containing material 136 from diffusing into IMD layer 130. Conductive lines 132 are also referred to as metal lines or metal pads hereinafter. The formation of conductive lines 132 may include a single damascene process.

Etch stop layer 138 and IMD layer 140 are formed over IMD layer 130 and conductive lines 132. In accordance with some embodiments of the present application, etch stop layer 138 is formed of a dielectric material selected from silicon carbide, silicon nitride, silicon oxynitride, silicon carbo-nitride, or the like. IMD layer 140 may be formed of a low-k dielectric material or a non-low-k dielectric material, and the material of IMD layer 140 may be selected from the same group of candidate materials for forming IMD 130.

Conductive via 142 and conductive line 144 are formed to electrically couple to conductive line 132. In accordance with some embodiments of the present disclosure, the formation of via 142 and conductive line 144 includes forming a via opening and a trench in IMD layer 140 and etch stop layer 138, performing a blanket deposition to form diffusion barrier 143, depositing a thin seed layer (not shown) of copper or copper alloy, and filling the rest of via opening and trench through, for example, electro-plating, electro-less plating, deposition, or the like with conductive material 145. Diffusion barrier 143 may be formed of titanium, titanium nitride, tantalum, tantalum nitride, or other alternatives. Conductive material 145 may include copper, a copper alloy, silver, gold, tungsten, aluminum, or the like. A planarization step such as CMP is performed to level the surface of the diffusion barrier 143 and conductive material 145, and to remove excess materials from the top surface of IMD layer 140.

FIG. 10A also schematically illustrates the formation of more dielectric (IMD) layers 146 and the respective conductive lines and vias (not shown) in dielectric layers 146. The number of IMD layers 146 is determined based on the routing requirement of wafer 100, and may range from 0 to 7 or more in accordance with some exemplary embodiments. The number of IMD layers 146 equaling to 0 means the subsequently formed etch stop layer 148 and IMD layer 150 are formed directly over IMD layer 140 with no additional dielectric layer and conductive lines therebetween. The conductive lines and vias (not shown) in IMD layers 146 are electrically coupled to integrated circuit devices 122.

Etch stop layer 148 and IMD layer 150 are formed over dielectric layers 146. In accordance with some embodiments of the present application, etch stop layer 148 is formed of a dielectric material selected from the same group of candidate materials for forming etch stop layer 126, wherein the candidate materials may include silicon carbide, silicon nitride, silicon oxynitride, silicon carbo-nitride, or the like. IMD layer 150 may also be formed of a low-k dielectric material or a non-low-k dielectric material, and the material of IMD layer 150 may be selected from the same group of candidate materials for forming IMDs 130 and 140.

Via 152 and conductive feature 154 are formed in IMD layer 150. The materials of via 152 and conductive feature 154 may be selected from same candidate materials for forming via 142 and conductive line 144. The formation process is also similar to the formation of via 142 and conductive line 144, and hence is not repeated herein. Conductive feature 154 includes a conductive pad and possibly a conductive line. As is shown in FIG. 10A, vias 142 and 152 may have a tapered profile, with the bottom widths smaller than the respective top widths. Although not shown, metal lines 144 and 154 may also have the tapered profiles with upper widths greater than the respective lower widths.

Dielectric layer 162 is formed over IMD layer 150. In accordance with some embodiments of the present disclosure, dielectric layer 162 is formed of a non-low-k dielectric material(s) such as Undoped Silicate Glass (USG), silicon oxide, silicon nitride, silicon oxynitride, or the like.

Metal via 164 and metal bump 166 are formed. In accordance with some embodiments of the present disclosure, via 164 and metal bump 166 are formed of copper, nickel, or another metal or metal alloy, and may or may not include a diffusion barrier layer. Metal via 164 and metal bump 166 may also include UBM 169. Metal via 164 extends into dielectric 162 to electrically connect to conductive feature 154. Accordingly, metal bump 166 is electrically coupled to conductive feature 132A through a plurality of conductive features. Throughout the description, dielectric layers 126 and 162 and the dielectric layers therebetween, and the conductive features in these dielectric layers are in combination referred to as interconnect structure 170. The conductive features connected to active devices 122 (if exist) are not shown, while they may be formed if devices active 122 are formed.

Figure 10B:
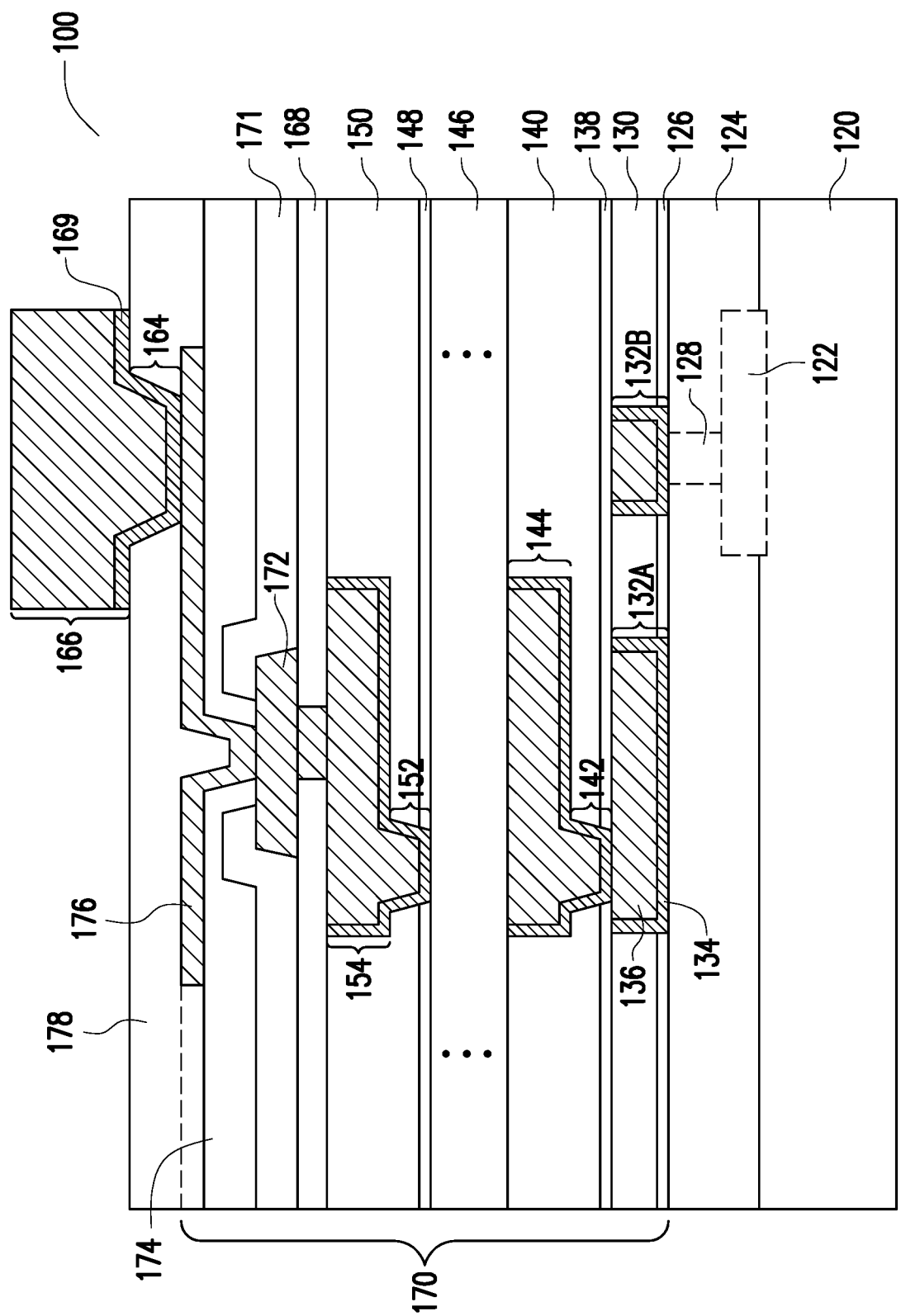

FIG. 10B illustrates a cross-sectional view of wafer 100 in accordance with alternative embodiments. In these embodiments, passivation layer 168, which is a dielectric layer, is formed over the IMD layer 150. Metal pad 172 is formed over passivation layer 168, and is electrically coupled to conductive feature 132A through metal lines and vias. Metal pad 172 may be an aluminum pad or an aluminum-copper pad, and other metallic materials may be used.

Passivation layer 171 is formed to cover the edge portion of metal pad 172, and a central portion of metal pad 172 is exposed through an opening in passivation layer 171. Each of passivation layers 168 and 171 may be a single layer or a composite layer, and may be formed of non-low-k dielectric materials. In accordance with some embodiments of the present disclosure, one or both of passivation layers 168 and 171 is a composite layer comprising a silicon oxide layer (not shown), and a silicon nitride layer (not shown) over the silicon oxide layer.

Polymer layer 174 is formed over passivation layer 171. Polymer layer 174 may be formed of a polymer such as polyimide, PolyBenzOxazole (PBO), BenzoCycloButene (BCB), or the like. Polymer layer 174 is patterned, and Post-Passivation Interconnect (PPI) 176 is formed, which includes a first portion overlying polymer layer 174, and a second portion extending into polymer layer 174 to electrically couple to metal pad 172. Polymer layer 178 is formed over polymer layer 174. Polymer layer 178 may be formed of polyimide or other polymer-based materials such as PBO or BCB. Metal via 164, which may include a lower portion of UBM 169 and a lower portion of the metal that forms the upper port of metal bump 166, extends into polymer layer 178 to contact PPI 176.

Referring back to FIG. 1, a plurality of device dies 20A and 20B (collectively referred to as device dies 20) is bonded to wafer 100 through solder regions 22 using flip-chip bonding. The respective step is illustrated as step 204 in the process flow shown in FIG. 11. Device dies 20 may include logic dies and/or memory dies. The logic dies may include Central Processing Unit (CPU) dies, Micro Control Unit (MCU) dies, Input-output (IO) dies, BaseB and (BB) dies, or Application processor (AP) dies. The memory dies may include flash dies, Static Random Access Memory (SRAM) dies, Dynamic Random Access Memory (DRAM) dies, low power Double-Data-Rate (DDR) die, High Bandwidth Memory (HBM), or the like.

Figure 2:
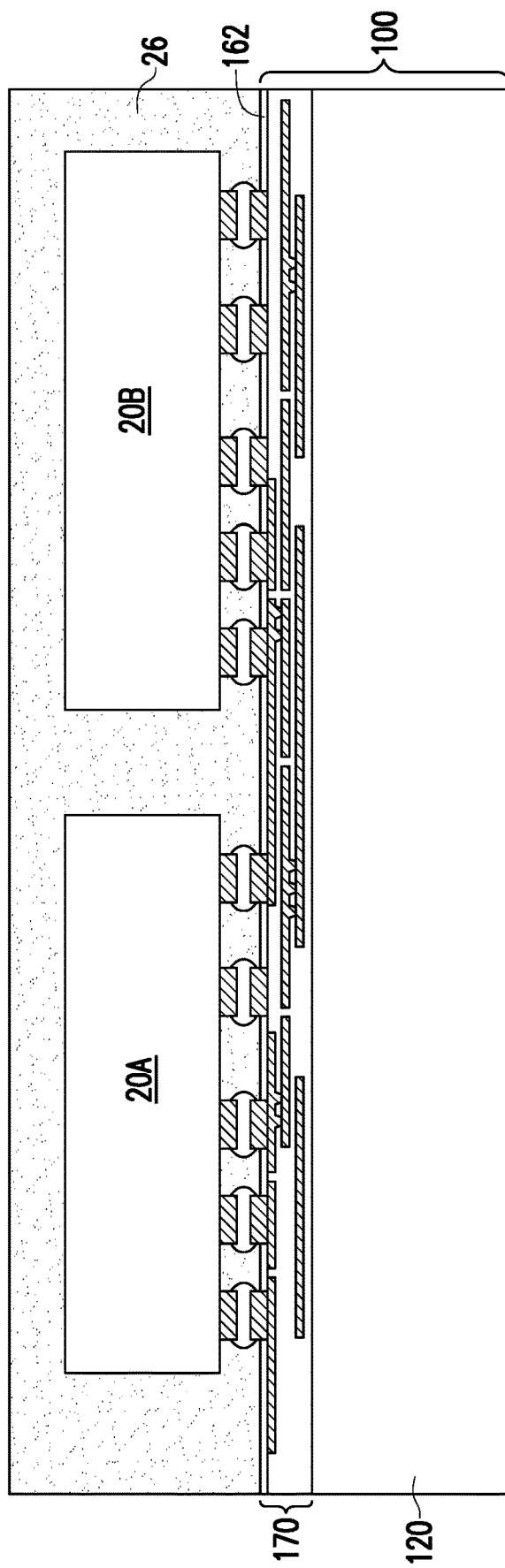

Referring to FIG. 2, device dies 20 are encapsulated in encapsulating material 26. The respective step is illustrated as step 206 in the process flow shown in FIG. 11. Encapsulating material 26 is dispensed and then cured, for example, in a thermal curing process. Encapsulating material 26 fills the gaps between device dies 20. Encapsulating material 26 may include a molding compound, a molding underfill, an epoxy, or a resin. Encapsulating material 26 may also include filler particles formed of, for example, $Al_2O_3$. After the encapsulation, the top surface of encapsulating material 26 may be higher than or substantially coplanar with device dies 20.

Figure 3:
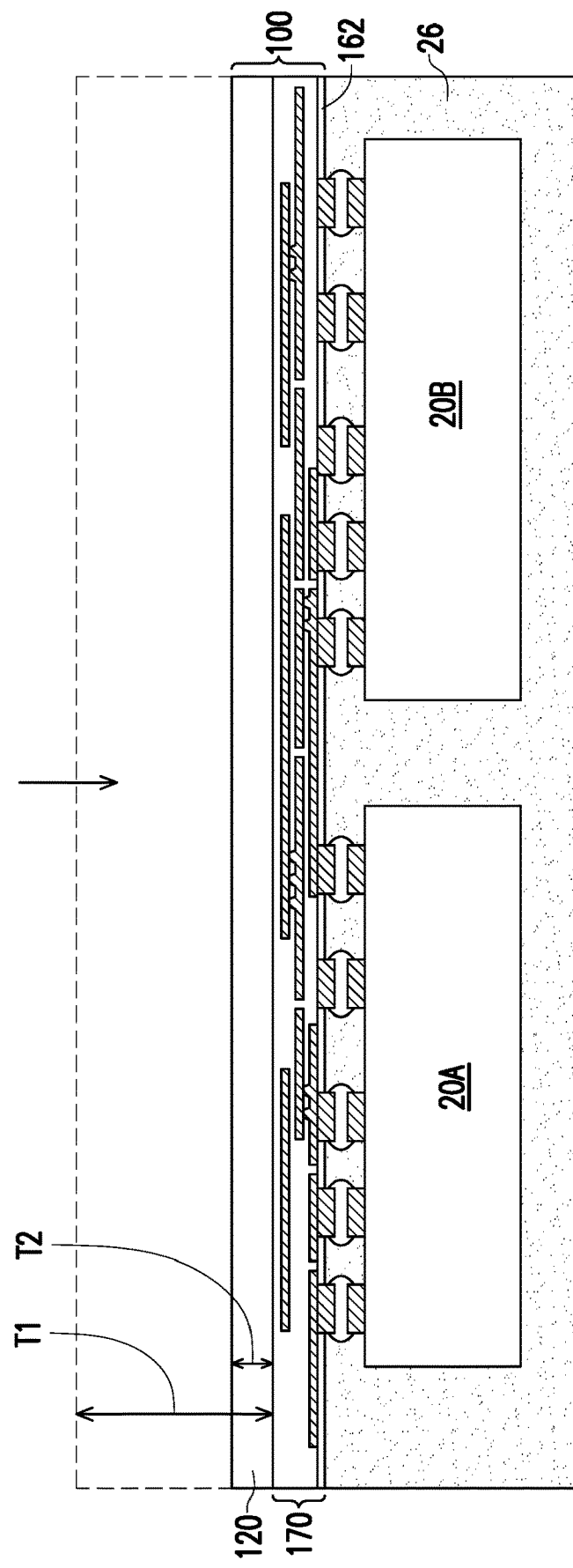

FIG. 3 illustrates the thinning of wafer 100, wherein substrate 120 is grinded from the backside (the illustrated topside) of substrate 120. The respective step is illustrated as step 208 in the process flow shown in FIG. 11. Accordingly, the thickness of substrate 120 is reduced from thickness T1 to thickness T2. The dashed line represents the portion of substrate 120 removed during the grinding. In accordance with some embodiments of the present disclosure, thickness T2 of the thinned substrate 120 is in the range between about 2 µm and about 20 µm.

Figure 4:
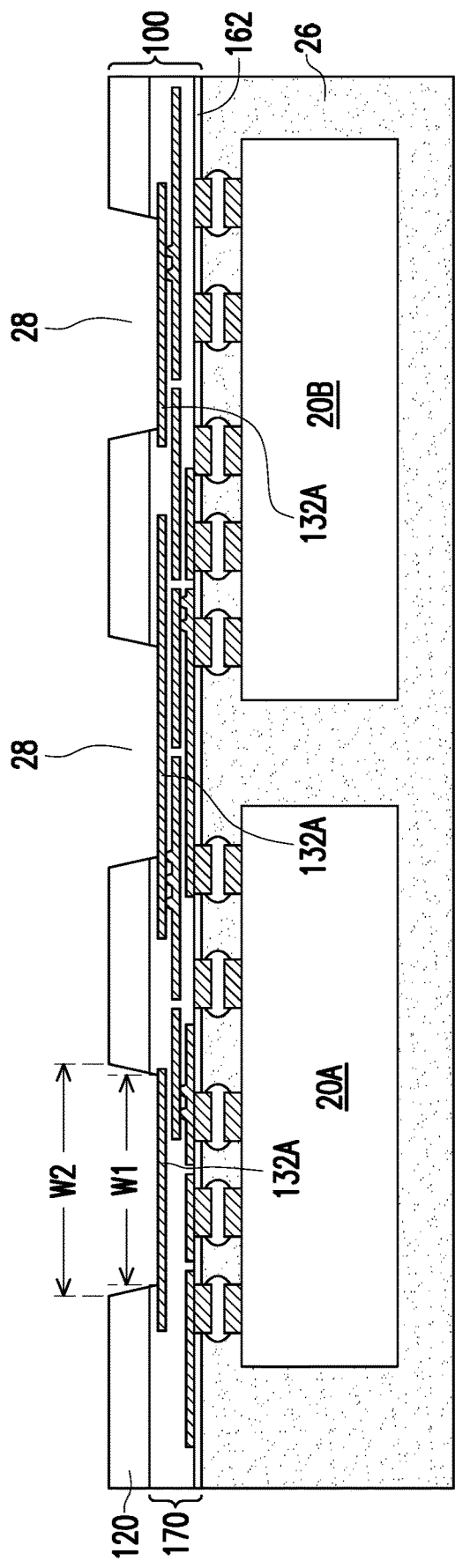

Referring to FIG. 4, wafer 100 is etched from backside to form openings 28 in order to expose conductive features 132A. The respective step is illustrated as step 210 in the process flow shown in FIG. 11. The exposed portions of conductive features 132A may be metal pads. The etch may be performed using metal pads 132A as an etch stop layer. In accordance with some embodiments of the present disclosure, the edges of openings 28 are slightly slanted, with the bottom width W1 smaller than top width W2 since the etch is performed from the top side.

Figure 5:
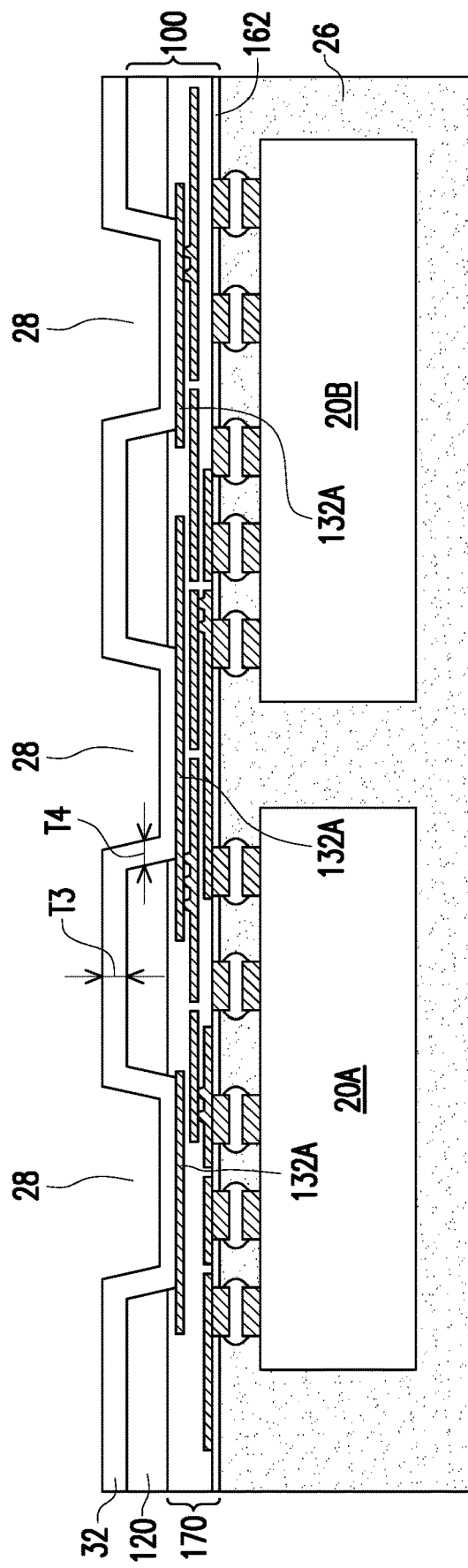

Next, referring to FIG. 5, polymer layer 32 is formed as a blanket layer to cover substrate 120 and the exposed metal pad 132A. The respective step is illustrated as step 212 in the process flow shown in FIG. 11. The thickness of polymer layer 32 may be in the range between about 2 µm and about 4 µm, for example. Polymer layer 32 penetrates through substrate 120, and surrounds the subsequently formed UBM or bump, and hence helps reduce stress in the resulting package. In accordance with some embodiments, polymer layer 32 is formed of polyimide, PBO, BCB, or the like. Polymer layer 32 may be a substantially conformal layer, with the differences between thickness T3 of the horizontal portions and thickness T4 of the vertical portions being smaller than about 30 percent of both of thicknesses T3 and T4, for example.

Figure 6A:
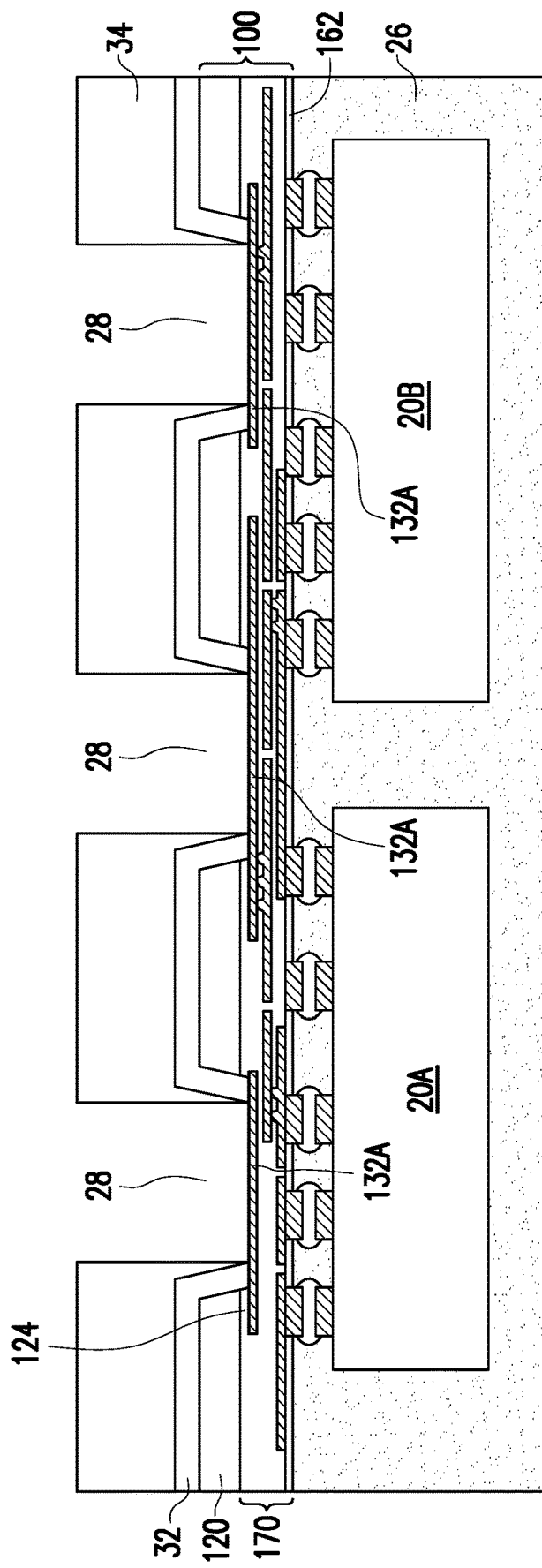

FIG. 6A illustrates the patterning of polymer layer 32 in accordance with some embodiments of the present disclosure. The respective step is illustrated as step 214 in the process flow shown in FIG. 11. A photo lithography process may be performed, for example, by exposing and developing polymer layer 32 if polymer layer 32 is formed of a light sensitive material such as polyimide. In accordance with alternative embodiments in which polymer layer 32 is formed of a material that is not light sensitive, the patterning of polymer layer 32 includes applying photo resist 34 and patterning photo resist 34 through light exposure and development, and etching polymer layer 32 using the patterned photo resist 34 as an etching mask. Photo resist 34 is then removed.

Figure 6B:
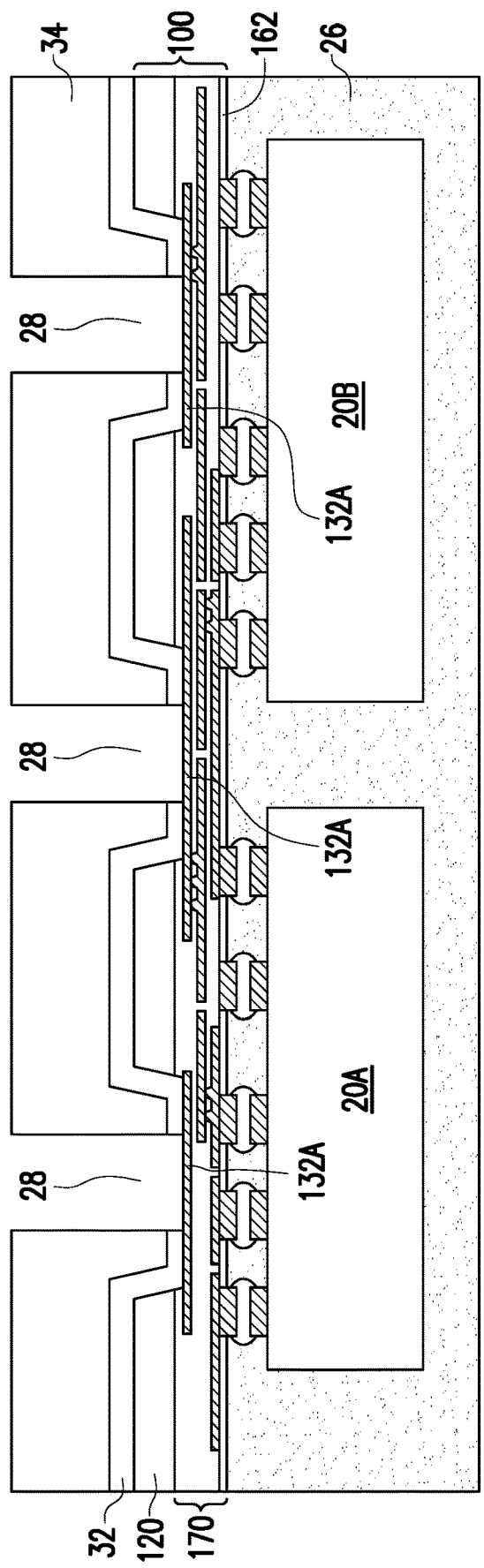

In accordance with some embodiments, as shown in FIG. 6A, substantially all horizontal portions of polymer layer 32 in openings 28 are removed, so that the contact areas between conductive features 132 and the subsequently formed UBMs are maximized. The remaining polymer layer 32 covers the sidewalls of substrate 120 and the sidewalls of dielectric layer 124. In accordance with alternative embodiments, as shown in FIG. 6B, in order to provide an adequate process margin for misalignment, the opening in polymer layer 32 is smaller than the respective opening 28. Accordingly, the remaining portions of polymer layer 32 include horizontal portions at the bottoms of openings 28, wherein the remaining horizontal portions are in physical contact with the top surfaces of conductive features 132A.

Figure 7:
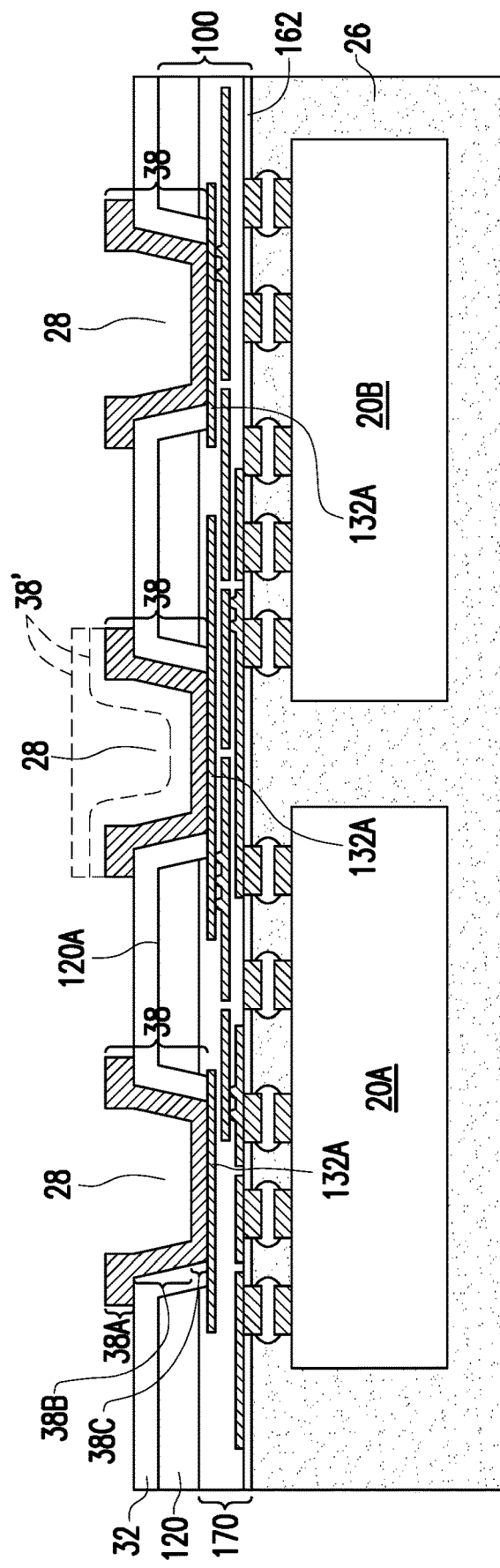

Referring to FIG. 7, UBMs 38 are formed to extend into openings 28. The respective step is illustrated as step 216 in the process flow shown in FIG. 11. UBMs 38 are encircled by the respective contacting portions of polymer layer 32. UBMs 38 are formed of a conductive material such as a metal or a metal alloy. UBMs 38 may be formed of a copper layer or a composite layer including a titanium layer and a copper layer over the titanium layer. In accordance with some embodiments of the present disclosure, UBMs 38 fill the bottom portions of openings 28, and leaving the top portions of openings 28 unfilled. For example, UBMs 38 includes top portion 38A over the top surface of polymer layer 32, sidewall portions 38B on the sidewalls of openings 28, and bottom portions 38C at the bottoms of openings 28. The bottom portions 38C may also have substantially planar top surfaces. The top surfaces of bottom portions 38C may also be higher than, substantially coplanar with, or lower than, the top surface 120A of substrate 120, wherein dashed lines 38' schematically represent the several possible positions of the top surfaces of UBMs 38. As shown in FIG. 7, depending on the aspect ratio of openings 28 and the process for forming UBMs 38, UBMs 38 may have recesses, or may be substantially free from recesses. Also, UBMs 38 may fully fill openings 28, and hence forming metal bumps.

In accordance with some embodiments, the formation of UBMs 38 includes blanket depositing a blanket UBM layer, and etching the undesired portions of the blanket UBM layer using a patterned photo resist (not shown) as an etching mask, leaving the UBMs 38 as shown in FIG. 7. In accordance with alternative embodiments, the formation of UBMs 38 includes depositing a seed layer, which may be a copper layer or may include a titanium layer and a copper layer over the titanium layer, forming a patterned mask (not shown) over the seed layer, plating a metallic material on the portions of the seed layer exposed through the openings in the patterned mask, removing the patterned mask, and etching the portions of the seed layer covered by the removed patterned mask.

Figure 8:
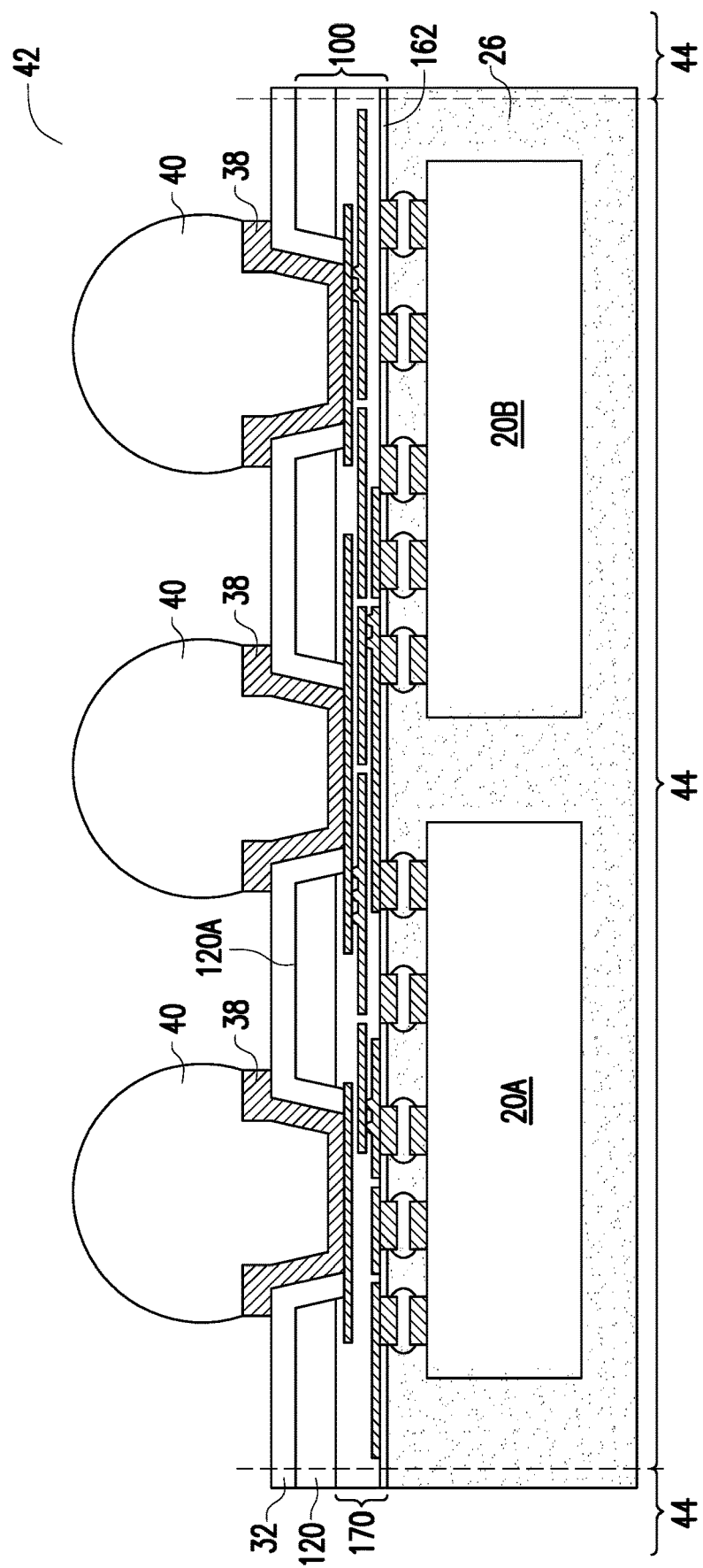

FIG. 8 illustrates the formation of solder regions 40. The respective step is illustrated as step 218 in the process flow shown in FIG. 11. The formation methods may include dropping solder balls on UBMs 38, and reflowing the solder balls to form solder regions 40. Alternatively, solder regions 40 are formed by printing a solder paste followed by a reflow. In accordance with some embodiments, solder regions 40 have bottom portions lower than the top surface 120A of substrate 120. Alternatively stated, solder regions 40 may have bottom portions in substrate 120 (although encircled by the portions of polymer layer 32 and UBMs 38 in substrate 120). Throughout the description, the structure shown in FIG. 8 is referred to as wafer-level package 42.

Figure 9A:
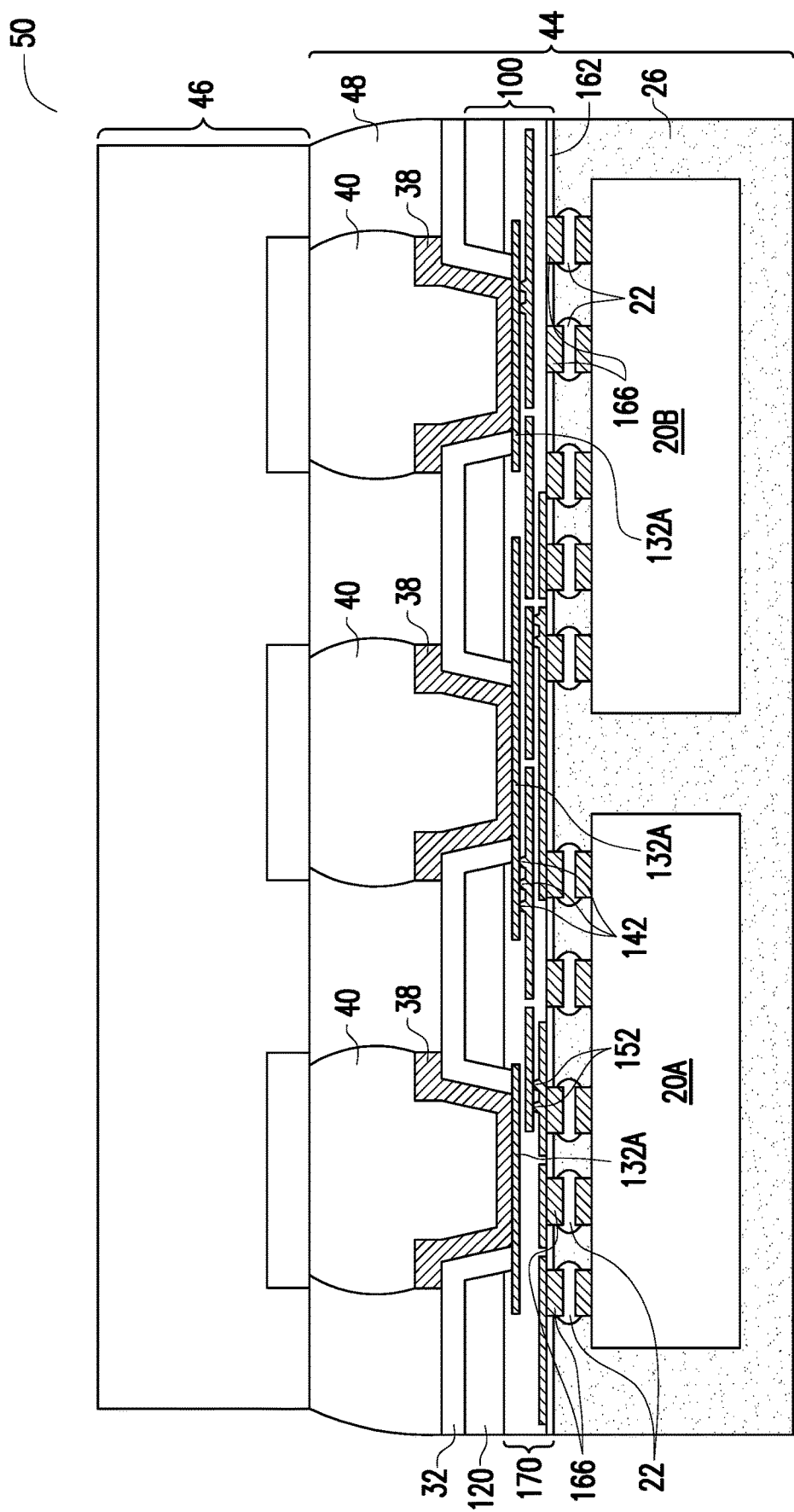

Next, wafer-level package 42 is singulated in a die-saw process, and is separated into a plurality of packages 44. The respective step is illustrated as step 220 in the process flow shown in FIG. 11. Package 44 is then bonded to package component 46 to from package 50, as shown in FIG. 9A. The respective step is illustrated as step 222 in the process flow shown in FIG. 11. In accordance with some embodiments, package component 46 is a package substrate. In accordance with alternative embodiments, package component 46 is a Printed Circuit Board (PCB). In accordance with some exemplary embodiments, underfill 48 is disposed between package 44 and package component 46.

Figure 9B:
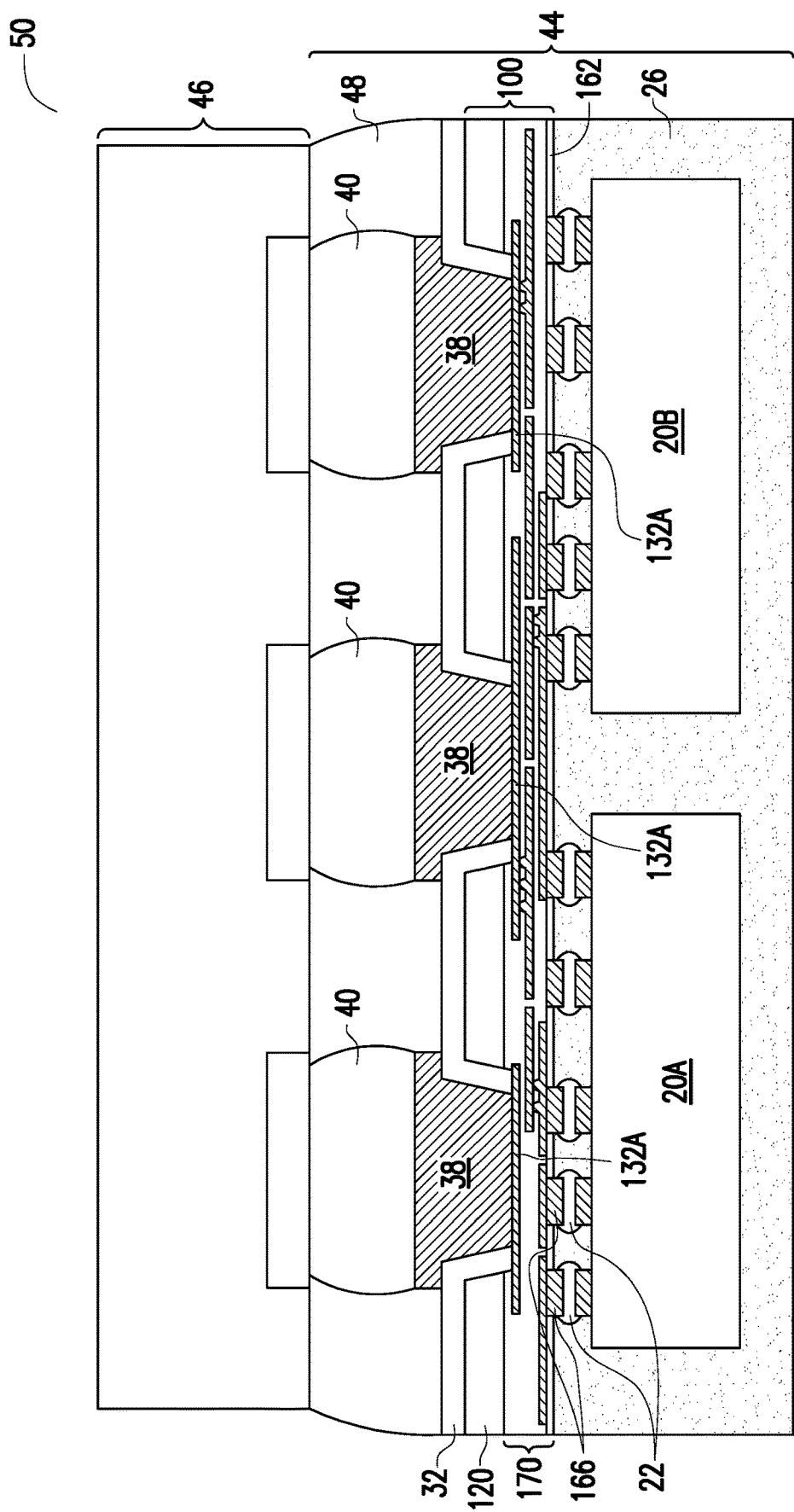
FIGS. 9B and 9C illustrate the cross-sectional views of packages including UBMs penetrating through the respective substrates in accordance with some embodiments.

FIG. 9B illustrates the package 50 in accordance with some embodiments of the present disclosure. In accordance with these embodiments, bumps 38 are formed to fully fill openings 28 (FIG. 4), and the top surfaces of bumps 38 may be higher or lower than the top surfaces of polymer layer 32.

Figure 9C:
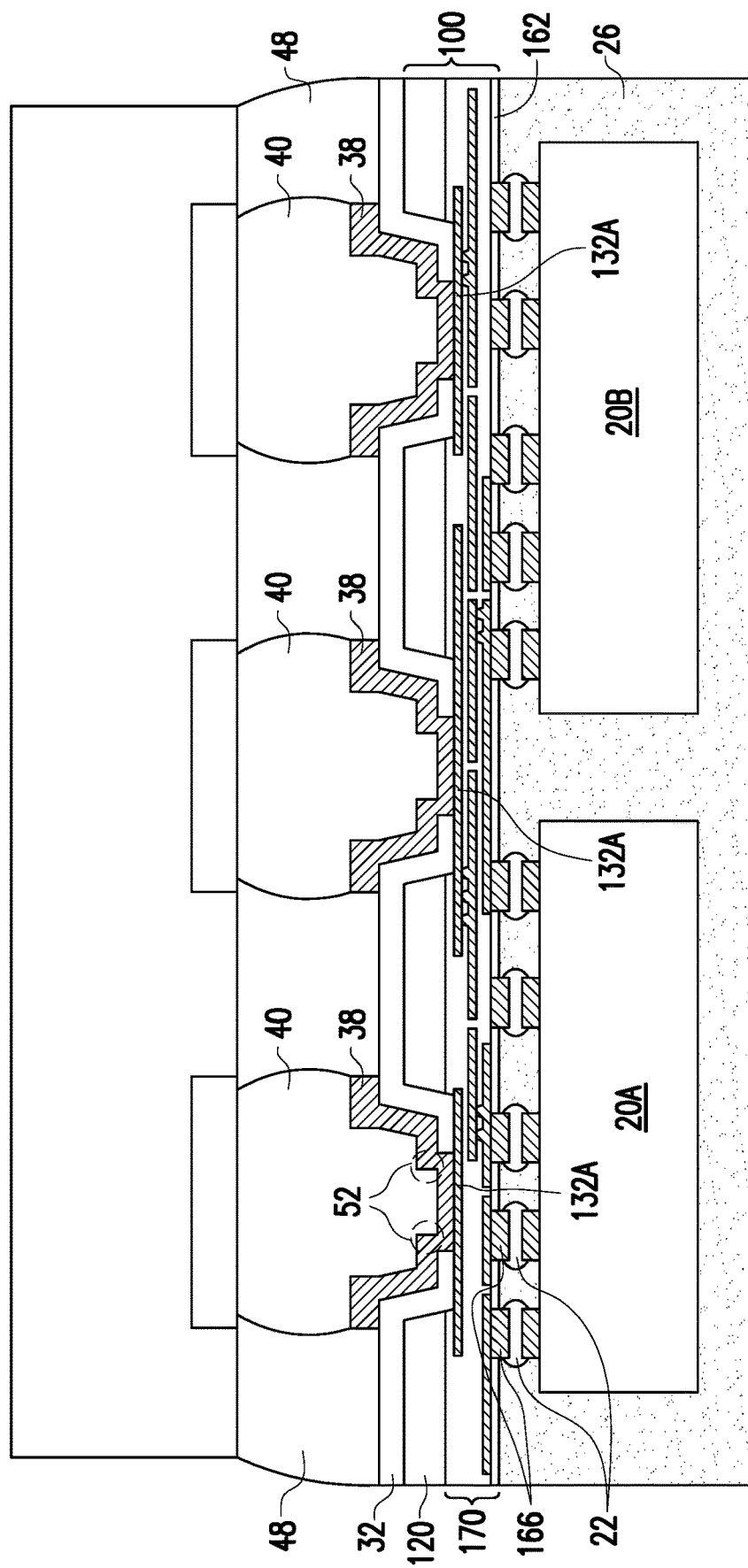

FIG. 9C illustrates the package 50 in accordance with some embodiments of the present disclosure, in which polymer layer 32 is formed to have the shape as shown in FIG. 6B, and UBMs 38 include horizontal portions at the bottoms of openings 28. Accordingly, as shown in FIG. 9C, UBMs 38 may form steps 52 as bottom portions.

The embodiments of the present disclosure have some advantageous features. In accordance with the embodiments of the present disclosure, the substrate remains in the final package to provide the mechanical support. The substrate is ground from backside to be very thin, and hence UBMs can be formed as the through-substrate connection. The electrical path is thus reduced due to the reduced length of the UBMs. Furthermore, the thermal performance of the package is improved since the thickness of the substrate is reduced. In addition, the polymer layer penetrating through the substrate help reduce stress in the resulting package.

In accordance with some embodiments of the present disclosure, a package includes a substrate, an Under-Bump Metallurgy (UBM) penetrating through the substrate, a solder region over and contacting the UBM, and an interconnect structure underlying the substrate. The interconnect structure is electrically coupled to the solder region through the UBM. A device die is underlying and bonded to the interconnect structure. The device die is electrically coupled to the solder region through the UBM and the interconnect structure. An encapsulating material encapsulates the device die therein.

In accordance with some embodiments of the present disclosure, a package includes a semiconductor substrate, a dielectric layer underlying and in contact with the semiconductor substrate, and an interconnect structure underlying the dielectric layer. The interconnect structure includes a metal pad in contact with a bottom surface of the dielectric layer. An opening penetrates through the semiconductor substrate and the dielectric layer. A polymer layer includes a first portion overlapping the semiconductor substrate, and a second portion extending into the opening to contact the metal pad. A metal feature extends from a top surface of the first portion of the polymer layer to the metal pad. The metal feature is encircled by the polymer layer.

In accordance with some embodiments of the present disclosure, a method includes bonding a device die to a wafer. The wafer includes a substrate and an interconnect structure. The method further includes thinning the substrate, etching the substrate to form an opening in the substrate, wherein a metal pad in the interconnect structure is exposed through the opening, forming a polymer layer to cover the substrate, wherein the polymer layer extends into the opening to cover the metal pad, etching the polymer layer to expose the metal pad, and forming a metal feature overlying the polymer layer. The metal feature extends into the opening to contact the metal pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an interconnect structure over an active device on a substrate;
    coupling the interconnect structure to a device die;
    after coupling the interconnect structure to the device die, grinding the substrate to reduce a thickness of the substrate;
    after grinding the substrate, forming an opening in the substrate that extends to a metal feature of the interconnect structure, wherein the opening has a first width and a second width, the first width and the second width being different; and
    depositing a polymer layer over the substrate, wherein the polymer layer extends into the opening to cover the metal feature and sidewalls of the substrate;
    patterning the polymer layer to expose the metal feature; and forming an Under Bump Metallurgy (UBM) extending into the opening, wherein the UBM has a first bottom portion in contact with the metal feature, and wherein the polymer layer extends from a second bottom portion of the UBM to the metal feature in a direction perpendicular to a major surface of the substrate.

2. The method of claim 1, wherein the coupling of the interconnect structure to the device die comprises bonding the interconnect structure to the device die using a first solder region.

3. The method of claim 1 further comprising encapsulating the device die with an encapsulating material such that a top surface of the encapsulating material is higher than a top surface of the device die.

4. The method of claim 3, wherein the encapsulating material includes filler particles that comprise $Al_2O_3$.

5. The method of claim 1, wherein forming the opening in the substrate comprises an etching process that uses the metal feature as an etch stop layer.

6. The method of claim 1 wherein patterning the polymer layer comprises removing a first horizontal portion of the polymer layer and leaving a second horizontal portion of the polymer layer in direct contact with the metal feature.

7. The method of claim 1 wherein the UBM comprises a first portion that has a top surface lower than a top surface of the substrate.

8. The method of claim 7, wherein the UBM is encircled by and in contact with a portion of the polymer layer.

9. The method of claim 8, further comprising forming a second solder region extending in the opening in the substrate, the second solder region covers the top surface of the first portion of the UBM.

10. The method of claim 9 wherein forming the second solder region comprises printing a solder paste followed by a reflow process.

11. A method comprising:
forming a dielectric layer on a front side of a substrate;
forming an interconnect structure on the dielectric layer;
bonding a device die to the interconnect structure;
etching a backside of the substrate to form an opening that extends to a metal pad of the interconnect structure;
forming a light-sensitive polymer layer extending into the opening, wherein the light-sensitive polymer layer directly contacts the metal pad and sidewalls of the substrate;
forming an Under Bump Metallurgy (UBM) that extends into the opening of the substrate; and
reflowing solder on the UBM to form a solder region.

12. The method of claim 11, wherein a bottom surface of the solder region is above a top surface of the substrate.

13. The method of claim 11, wherein a bottom surface of the solder region is below a top surface of the substrate.

14. The method of claim 11, wherein reflowing solder on the UBM comprises reflowing a solder ball to form the solder region.

15. The method of claim 11, wherein reflowing solder on the UBM comprises reflowing printed solder paste.

16. A method comprising:
forming an interconnect structure on a substrate, wherein the interconnect structure comprises:
a first passivation layer; and
a second passivation layer, a first portion of the second passivation layer being on the first passivation layer, a second portion of the second passivation layer being on a metal pad, and the second passivation layer comprising two dielectric materials having different material compositions from each other;
coupling a device die to the interconnect structure;
etching an opening in the substrate to expose a conductive feature of the interconnect structure;
depositing a photo-sensitive polymer layer into the opening, wherein the photo-sensitive polymer layer directly contacts sidewalls of the substrate and a top surface of the conductive feature; and
forming a metal feature extending through the substrate to contact the conductive feature, wherein the metal feature is encircled by and in contact with a portion of the photo-sensitive polymer layer.

17. The method of claim 16, wherein the first passivation layer comprises two dielectric materials having different material compositions from each other.

18. The method of claim 16, wherein the second passivation layer comprises silicon nitride and silicon oxide.

19. The method of claim 16 further comprising reflowing a solder ball on the metal feature.

20. The method of claim 19, wherein the reflowing the solder ball includes reflowing the solder ball to form a solder region that comprises steps as bottom regions.

* * * * *